United States Patent [19]

Sugimura et al.

[11] Patent Number: 4,653,051

[45] Date of Patent: Mar. 24, 1987

[54] APPARATUS FOR DETECTING AND CORRECTING ERRORS ON PRODUCT CODES

[75] Inventors: Tatuo Sugimura, Yawata; Isao Satoh, Neyagawa; Makoto Ichinose, Sakai; Yuzuru Kuroki, Moriguchi, all of Japan

[73] Assignee: Matsushita Electric Industrial Co., Ltd., Kadoma, Japan

[21] Appl. No.: 649,718

[22] Filed: Sep. 12, 1984

[30] Foreign Application Priority Data

Sep. 14, 1983 [JP] Japan ................................ 58-169565
Nov. 26, 1983 [JP] Japan ................................ 58-223601

[51] Int. Cl.[4] .......................................... G06F 11/10
[52] U.S. Cl. .......................................... 371/37; 371/49
[58] Field of Search ....................... 371/37, 38, 39, 40, 371/49, 50, 51, 52

[56] References Cited

U.S. PATENT DOCUMENTS

| | | | |
|---|---|---|---|
| 4,371,963 | 2/1983 | Edwards | 371/50 |
| 4,453,251 | 6/1984 | Osman | 371/50 |
| 4,456,980 | 6/1984 | Yamada | 371/50 |
| 4,464,747 | 8/1984 | Groudan | 371/50 |
| 4,549,295 | 10/1985 | Purvis | 371/38 |
| 4,564,945 | 1/1986 | Glover | 371/50 |

*Primary Examiner*—Michael R. Fleming
*Attorney, Agent, or Firm*—Cushman, Darby & Cushman

[57] ABSTRACT

Apparatus for detecting and correcting errors on product codes, utilizing a product code of minimum distance 2t symbols constituted by two codes having minimum distance 2 and minimum distance t respectively. First the code of minimum distance t is decoded, and secondly error number flags generated in the decoding operation are classified into three decoding modes by statistical processing. Errors are detected or corrected according to the decoding mode.

8 Claims, 9 Drawing Figures

CASE 1

F0 e=1

CASE 2

F1 e=2

CASE 3     CASE 4

F1   F1     F2 e=3

CASE 5     CASE 6     CASE 7

CASE 8
F1 F1 F1 F1

CASE 9
F2 F1 F1

CASE 10
(i) F3   F1
(ii) F2  F1

CASE 11
(i) F3
(ii) F2
(iii) F1 e=5

CASE 12
F1 F1 F1 F1 F1

CASE 13
F2 F1 F1 F1

CASE 14
(i) F3 F1 F1
(ii) F2 F1 F1

CASE 15
F2 F2 F1

CASE 16
(i) F3    F1
(ii) F2   F1
(iii) F1  F1

CASE 17
(i) F3   F2
(ii) F2  F2

CASE 18
(i) F3
(ii) F2
(iii) F1
(iv) F0

APPARATUS FOR DETECTING AND CORRECTING ERRORS ON PRODUCT CODES

BACKGROUND OF THE INVENTION

1. Field of the Invention

The present invention relates generally to a decoding system, and particularly to a decoding system capable of high speed decoding suitable for use in parity checking in digital information data transmission or recording with high reliability.

2. Description of the Prior Art

In transmission or recording and reproducing of digital information data, in order to prevent erroneous transmission or recording/reproducing of digital signal, a data sequence is blocked into blocked data of a predetermined length, and coding is performed for each blocked data. When a reliability and error characteristic of the transmission line or recording medium is not sufficient, there is a need to correct compound error wherein random error and burst error may exist together. Then, by randomizing the burst error into random error by means of interleaving, the random errors are corrected. When the object of error correction is only the random errors, or the compound errors, higher error correction capability for random errors contribute to higher reliability of digital information data. A product code has a characteristic the decoding the component code is easy with respect to its correction capability, and is good in harmonizing with the interleaving for correction of the compound error. Therefore the product code is being used more often for error correction in the system of transmission or recording of digital information data. In the code comprised of two or more component codes such as the product code, however, it is necessary that decodings of the component codes of the code must organically cooperate. For instance, in decoding of a product code constituted by two component codes, such repeated operation becomes necessary that after decoding a first component code, decoding a second component code is carried out by utilizing the result of the first decoding, and when necessary, decoding the first component code is repeated. Accordingly, in the decoding of the product code, though decoding of code of respective component codes are relatively simple, processing of the organic cooperation of the decoded results is complicated, and a general practical process has not yet been available in the prior art. The situation is the same for the case of a decoding process for the product code of two codes with a minimum distance 2 and a minimum distance t, which is a class of the product code. In transmission or recording of the digital information data, a high speed of processing is required for error correction, and hence, a method of high speed decoding of the product code becomes necessary.

SUMMARY OF THE INVENTION

The purpose of the present invention is to provide a decoding system capable of high speed decoding of a product code of minimum distance 2t constituted with two codes with minimum distance 2 and minimum distance t, wherein, with respect to information of (k×l) symbols arranged in a matrix with k rows and l columns, in each row a checksum symbol of l symbols is added for constituting code with minimum distance 2, and in each of (l+1) columns including a column for said added checksum symbols a set of parity check symbols are added for constituting a code with minimum distance t.

In order to attain the above-mentioned object, the decoding system in accordance with the present invention performs a first decoding of (l+1) codes in column direction by a first decoder, and then a deciding on the decoding mode among three decoding modes by statistical processing of the error number flags issued from the first decoder, and finally a second decoding in which, responding to the decided decoding mode, the decoding is made as assertion of simple error detection, or single erasure error correction by using codes in row direction, or error detection by using codes in row direction.

BRIEF DESCRIPTION OF THE DRAWING

FIG. 6($a$) is a block diagram showing an example of error number flag counter 7 of FIG. 4.

FIG. 6($b$) is a waveform diagram showing waveform of input signal to the error number flag counter of FIG. 6($a$).

DESCRIPTION OF THE PREFERRED EMBODIMENTS

Figure 1:
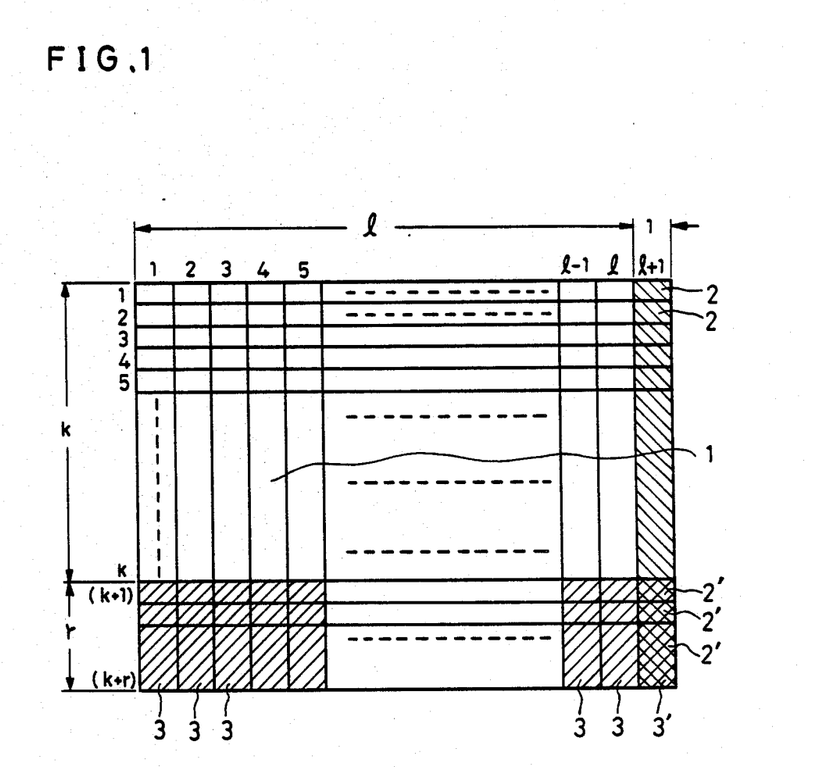
FIG. 1 is a diagram showing principle of constitution of a product code to which the decoding system in accordance with the present invention is applied.

Firstly, the principle of decoding procedure to be used in the decoding system in accordance with the present invention is explained. FIG. 1 is a diagram showing a constitution of a product code to which the present invention is applied. As shown in FIG. 1, the information data 1 are disposed in a matrix having k rows and l columns. The component elements of the matrix are referred to as symbols here, wherein one above-mentioned symbol is represented by i-bit tuple.

The checksum symbols 2 are obtained by performing exclusive ORs between respective i-bit elements of l symbols in each row of the matrix. Then, the next coding is made with respect to each column of the matrix comprising the symbols (k×[l+1]) for making a code with minimum distance t, and parity check symbols 3 consisting of r symbols are added to each of the (l+1) columns, thereby obtaining rows of distance (k+r) symbols. The matrix having ([k+r]×[l+1]) becomes a product code having minimum distance 2t. Here it is to be noted that, parity check symbols 3' for each of the r symbols are added to the (l+1)-th column to constitute checksum symbols 2' for the (k+1)-th row through (k+r)-th row. Also, it is to be noted that even when the order of coding of the rows and the columns may be interchanged, quite the same code can be constituted. Accordingly, the order of the coding between the rows and the columns does not limit the gist of the invention. Hereinafter, however, for the sake of simplicity of description, coding in rows is referred to as outer code and coding in columns are referred to as inner code; but these namings are not limited to the above-mentioned, and may be interchanged.

Figure 2:
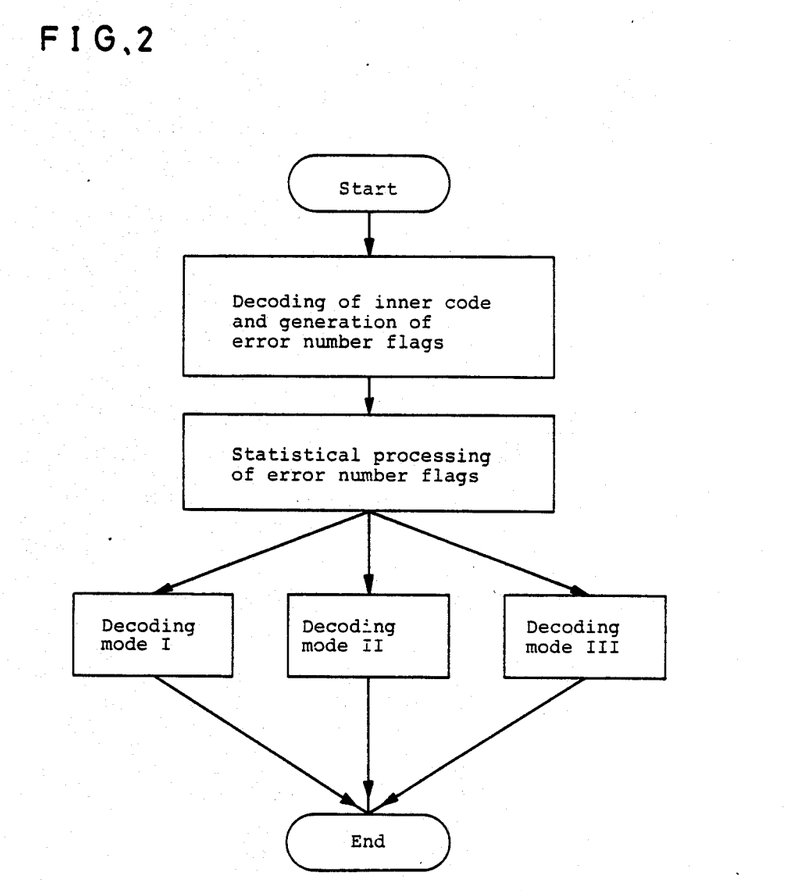
FIG. 2 is a flow chart showing process of decoding in the decoding system in accordance with the present invention.

Decoding of the product code in accordance with the decoding system embodying the present invention is carried out along the process shown in a decoding flow chart of FIG. 2. Firstly, a decoding process is carried out for the inner codes. Error number flags are issued as a result of the decoding of the inner codes. In an inner code which has a minimum distance t, error correction can be made for $$\lfloor \frac{t-1}{2} \rfloor$$

or less and error detection can be made for $$\lfloor \frac{t+1}{2} \rfloor$$

or more, wherein the expression $\lfloor x \rfloor$ represents a largest integer which is equal to or less than x. In the process of decoding operation of the inner codes, the below-mentioned error number flags Fi are set.

TABLE 1

| For case | : | Flags |
|---|---|---|
| No error | : | F0 |
| Single error correction | : | F1 |
| Double error correction | : | F2 |
| — | | — |
| — | | — |
| — | | — |
| $\lfloor \frac{t-1}{2} \rfloor$ -error correction | : | $F \lfloor \frac{t-1}{2} \rfloor$ |
| Error detection | : | $F \lfloor \frac{t+1}{2} \rfloor$ |

When an error which is beyond the correction capability of the inner code takes place, it is indeterminate which of setting a flag $$F \lfloor \frac{t+1}{2} \rfloor$$

for uncorrectable error or setting a flag Fj for erroneous j-error correction or setting a flag F0 for composing a erroneous codeword by chance with the error occurs. Thus, decoding of the (l+1) inner codes are carried out as above-mentioned.

Nextly, (l+1) error number flags obtained in the above-mentioned process are statistically processed, and as a result the following operations are classified into the following three modes.

Firstly, error number flags Fi are counted for each of the error numbers. Provided that number of occurrences of error number flags Fi is Ci, then the following equation (1) holds $$\sum_{i=0}^{\lfloor \frac{t+1}{2} \rfloor} C_i = l + 1. \quad (1)$$

The above-mentioned statistical processing and subsequent processing are elucidated.

Firstly, priorities are given to the flags in the order of from largest i sequentially to smallest i of Ci. Then, the following operations are classified in the below-mentioned correction modes. This decoding is referred to as the first type decoding method.

[First type decoding method]

(i) Decoding mode I:

$$\left( C \lfloor \frac{t+1}{2} \rfloor \geq 2 \right)$$

This is when the "Error detection" is made twice or more.

(ii) Decoding mode II:

This is when the Ci of the highest priority order in non-zero Ci's is 1.

(iii) Decoding mode III:

This is the case other than the above-mentioned two modes.

Then, error correction processing to be carried out by utilizing outer codes corresponding to the above-mentioned decoding modes I, II and III are as follows:

(a) Decoding mode I:

Detection of uncorrectable error is unconditionally asserted.

(b) Decoding mode II:

A pointer is put on a row of the inner code whereat an error number flag Fi for the Ci of the highest priority order in non-zero Ci's is 1. Then, checksum is made for outer codes of received sequence or read out sequence, and the checksum is added to the row on which the pointer is put on. Alternatively, the checksum of the outer codes are obtained with respect to the rows other than the pointer being put on, and the resultant checksum is substituted in place of the row on which the pointer is put.

(c) Decoding mode III:

Checksum by outer codes of the received sequence or lead out sequence are obtained and:

(c-1) When checksum is 0, there is no error, (c-2) When the checksum is not 0, detection of uncorrectable error is asserted.

As has been described in the above, by decoding the product codes, error correction for symbols (t−1) in length or less and error detection for symbol t becomes possible for product codes of minimum distance 2t.

[Second type decoding method]

By utilizing data processing method different from the above-mentioned, other statistical processing can be proposed. In a proposed second type decoding method, by limiting the error number flag to be noted only to $$F \lfloor \frac{t+1}{2} \rfloor ,$$

namely to the error detection flag, the number of occurrences of error $$C\left\lfloor \frac{i+1}{2} \right\rfloor$$

is noted. Similar to the above-mentioned first type decoding method, three modes I, II and III are defined as follows:

(i) Decoding mode I:

$$\left( C\left\lfloor \frac{i+1}{2} \right\rfloor \geq 2 \right)$$

(ii) Decoding mode II:

$$\left( C\left\lfloor \frac{i+1}{2} \right\rfloor = 1 \right)$$

(iii) Decoding mode III:

$$\left( C\left\lfloor \frac{i+1}{2} \right\rfloor = 0 \right)$$

Error correction and error detection operation by using the outer codes for these three modes are carried out as follows:

(a) Decoding mode I:
Detection of uncorrectable error is unconditionally asserted.

(b) Decoding mode II:
A pointer is put on the row having the inner codes at which $$F\left\lfloor \frac{i+1}{2} \right\rfloor$$

arises. Checksums at outer codes of the received sequence or reproduced sequence are obtained, and the resultant checksum is added to the row on which the pointer is put through an exclusive OR logic. Alternatively, the checksum of the outer codes are obtained with respect to the rows other than the pointer being put on, and the resultant checksum is substituted in place of the row on which the pointer is put.

(c) Decoding mode III:
Checksum by outer codes of the received sequence or lead out sequence are obtained and:
(c-1) When checksum is 0, there is no error,
(c-2) When the checksum is not 0, detection of uncorrectable error is asserted.

As described in the above, by decoding the product codes, through not absolutely equal to the above-mentioned first decoding method, the substantially utilizable performance almost similar to that of the first type decoding method is obtainable. This second type decoding method can be considered as a method which is simplified to the utmost extent from the first type decoding method. In other words, in the first type decoding method, in classifying of the decoding mode, all of Fi for i within the range of $$1 < i \leq \left\lfloor \frac{i+1}{2} \right\rfloor \quad (2)$$

is noted; while in the second type decoding method, in classifying of the decoding mode, only one error number flag $$F\left\lfloor \frac{i+1}{2} \right\rfloor$$

is noted. Accordingly, it is naturally considered a third type decoding method, which is intermediate between the first type decoding method and the second type decoding method, wherein, for instance, in classifying of the decoding mode two error number flags $$F\left\lfloor \frac{i+1}{2} \right\rfloor \text{ and } F\left\lfloor \frac{i-1}{2} \right\rfloor$$

are noticed or three error number flags $$F\left\lfloor \frac{i+1}{2} \right\rfloor, F\left\lfloor \frac{i-1}{2} \right\rfloor \text{ and } F\left\lfloor \frac{i-3}{2} \right\rfloor$$

are noticed, and so on, may be considered. The intermediate method naturally has a performance more close to the first type decoding method rather than the second type decoding method. Of course, there is another decoding method wherein error number flags to be noted is not of a consecutive priority order, for instance, a method to note appearance of $$F\left\lfloor \frac{i+1}{2} \right\rfloor$$

and F1, but such method has lower performance in at least random error correction capability in comparison with the method noticing occurrences of $$F\left\lfloor \frac{i+1}{2} \right\rfloor \text{ and } F\left\lfloor \frac{i-1}{2} \right\rfloor.$$

Figure 3:
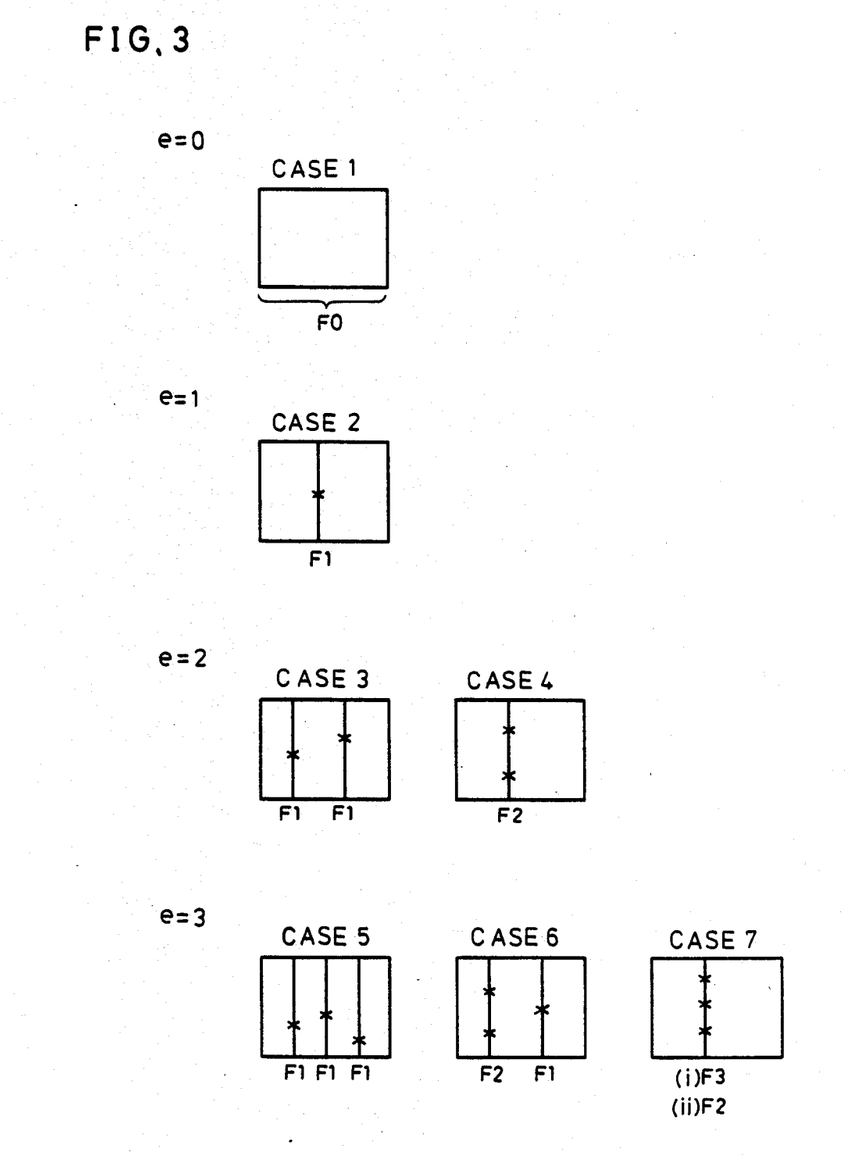
FIG. 3 is a set of schematical diagrams showing error corrections of various kinds in the decoding system in accordance with the present invention.

Hereafter, the process of decoding in accordance with the present invention is elucidated on an actual example wherein the minimum distance t of the inner code is 5 and hence the minimum distance of the product code is 10. In this example, since the product code has the minimum distance 10, error correction of 4 symbols or less and error detection of 5 symbols are theoretically possible. FIG. 3 shows patterns for all cases of errors of 5 or less symbols. In FIG. 3, cases are classified by error number e occurring in the whole of the product code and further by error numbers of inner code in respective colums. The error number flags generated by decoding of the inner code are shown at the position below the respective columns. Though in the columns having no error the flag F0 is generated, the flag F0 is shown only for the case of e=0, and in the cases of e=1 or larger e the flags F0 are omitted from the drawing for simplicity. Furthermore, since the minimum distance of the inner code is 5, error correction for 2 symbols or less is possible for respective columns of the inner code. But in case of an error for 3 symbols or more, which is beyond the error correction capability, the error detection flag F3 is not necessarily generated. When errors of 3 symbols are generated in one column of the inner code like the CASEs 7, 10, 14 and 17, since the minimum distance of the inner code is 5, there are two liabilities of processing, namely, error correction being impossible or erroneous correction of two symbols being made. In the former processing a flag F3 is generated and in the latter processing a flag F2 is generated.

In the similar way, in 4 symbol errors of CASEs 11 and 16, either one of flags F3, F2 or F1 is generated; and in the 5 symbols errors of CASE of 18, either one of the flags F3, F2, F1 or F0 is generated and classified. Classification of decoding mode in accordance with the aforementioned first type decoding method yields the following results.

(A) Decoding mode I:
No case
(B) Decoding mode II:
CASEs 2, 4, 6, 7, 9, 10, 11, 13 14, 16(i), 16(ii), 17(i), 18(i), 18(ii) and 18(iii).
(C) Decoding mode III:
CASEs 1, 3, 5, 8, 12, 15, 16(iii), 17(ii) and 18(iv).

Among the CASEs classified in the decoding mode II, there is such a case that in decoding the inner code all the occurring errors are corrected, and even in such case processing of a single erasure correction using the outer code is carried out. In such case, there is no fear of addition of a fresh error by such correction processing. In the cases other than above, since errors in the column other than those put on with the pointer by the decoding of the inner code is appropriately corrected by error correction processing using the outer code errors in the column on which the pointer input are corrected.

The decoding mode III is for detecting whether the error is appropriately corrected or not using the inner code, and detection of an correctable errors are asserted only for the CASEs 16(iii), 17(ii) and 18(iv).

As has been described, in the example product code of the minimum distance 10, errors correction of 4 or less symbols and error detection of 5 symbols which is theoretically possible can be done according to the decoding method of the present invention. In the similar way, for the cases of the minimum distances 2, 3, 4 and 6 or more of the inner code, the theoretical possibility of error control ability can be proved. When the product code having minimum distance 10 as described in the preceding example is transmitted or decoded in the direction of a row, namely in the direction of the outer code, and the decoding method in accordance with the present invention is used, error correction is possible even when a compound error consisting of a burst error of 2 rows, i.e. 2×(l+1) symbol length or less and 1 symbol random error, or burst error of 1 row, i.e. (l+1) symbol length or less and 2 symbol random errors, or the like, arise at the same time.

When the cases of error patterns are classified with decoding modes in accordance with the second type decoding method, classification becomes as follows.

(A) Decoding mode I:
No case
(B) Decoding mode II:
CASEs 7(i), 10(i), 11(i), 14(i), 16(i), 17(i) and 18(i).
(C) Decoding mode III:
CASEs 1, 2, 3, 4, 5, 6, 7(ii), 8, 9, 10(ii) 11(ii), 11(iii), 12, 13, 14(ii), 15, 16(ii), 16(iii), 17(ii), 18(ii), 18(iii), and 18(iv).

In case the error is classified as the decoding mode II, apart from the decoding mode II of the first type decoding method, though there is necessarily at least an error at the code sequence where the pointer is put on, the code sequence other than that is appropriately corrected, and accordingly the error of the code sequence where the pointer is put on is rightly corrected by means of error correction processing using the outer codes.

In the decoding mode III, in the CASEs 10(ii), 11(ii), 11(iii), 14(ii), 16(ii), 16(iii), 17(ii), 18(ii), 18(iii), 18(iv), detection of uncorrectable errors is asserted. However, when the minimum distance of the inner codes are sufficiently large, for instance, in the example of using the inner code of minimum distance 5, even at occurrence of errors beyond the correction capability of the inner code the probability of making undesirable erroneous correction or erroneous detection is very small. As a result, the performance this second type decoding method is almost the same as the performance of the first type decoding method.

[Third type decoding method]

As a third type decoding method, which is an intermediate decoding method between the first type decoding method and the second type decoding method, a decoding method noticing the occurrence of two error number flags of $$F3\left(=F\lfloor\frac{t+1}{2}\rfloor\right) \text{ and } F2\left(=F\lfloor\frac{t-1}{2}\rfloor\right)$$

is considered. This third type decoding method also has the following three decoding modes.

(A) Decoding mode I:
No case
(B) Decoding mode II:
CASEs 4, 6, 7, 9, 10, 11(i), 11(ii), 13, 14, 16(i), 16(ii), 17, 18(i) and 18(ii).
(C) Decoding mode III:
CASEs 1, 2, 3, 5, 8, 11(iii), 12, 15, 16(iii), 18(iii) and 18(iv).

As is obvious from the comparison with the first type decoding method and the second type decoding method, in the third type decoding method too, detections of uncorrectable errors are asserted for the CASEs 11(iii), 16(iii), 18(iii) and 18(iv). Accordingly, the performance of this third type decoding method is evaluated as that between the first type decoding method and the second type decoding method.

Hereafter, one actual embodiment of a decoding system embodying the present invention is described with reference to FIG. 4 and thereafter.

Figure 4:
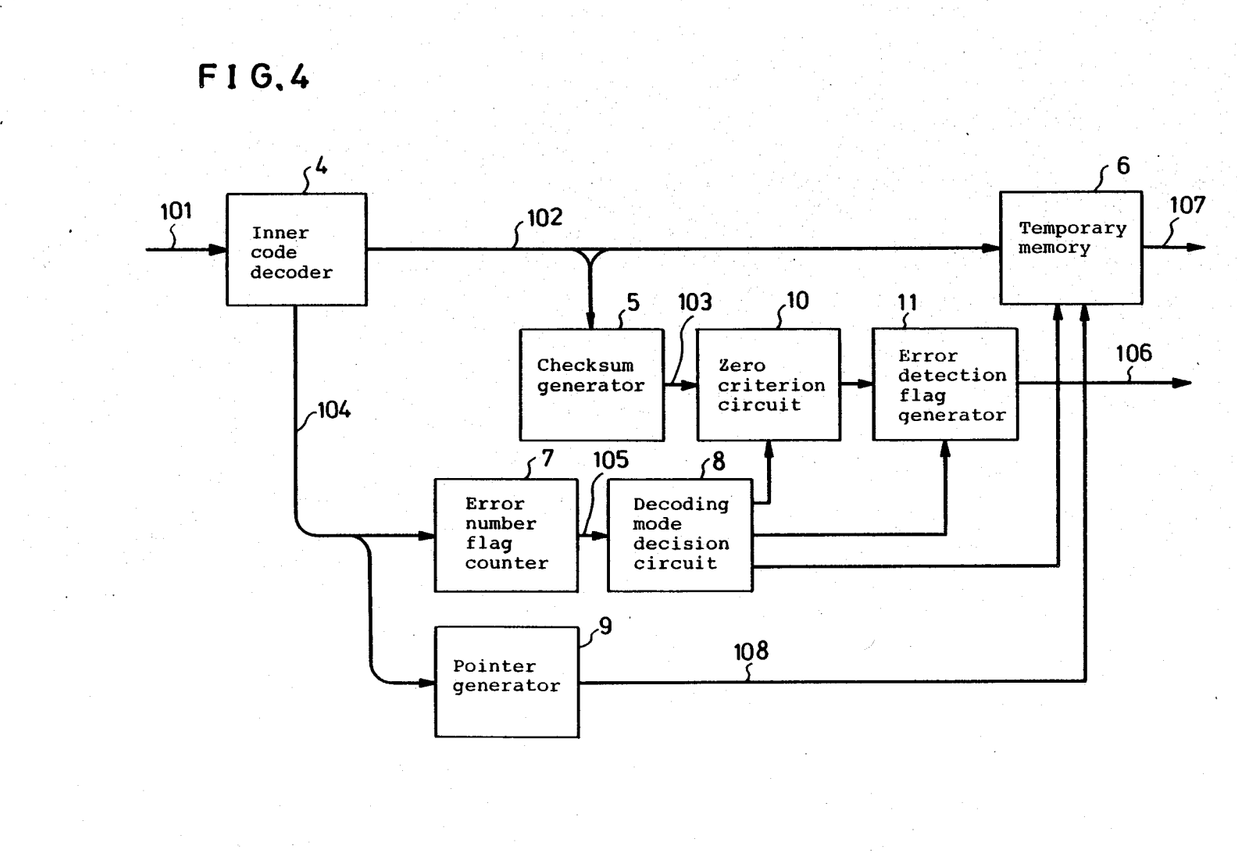
FIG. 4 is a block diagram showing one embodiment of decoding system in accordance with the present invention.

FIG. 4 is a block diagram of the actual embodiment of the decoding system in accordance with the present invention. An input signal to this decoding system, is a product code which has been transmitted or recorded in the direction of the row, that is, in the direction of outer codes which are sequentially received or reproduced is inputted. The input information data are firstly stored in a memory in the form of a matrix shown in FIG. 1, and the information data are sequentially read out in the direction of columns and input as the input signal 101 to the inner code decoder, wherein decoding of the inner code is carried out for (k+r) symbols in every column. Then the decoded sequence data 102 are stored in a temporary memory 6. At the same time, the checksum generator 5 receives the decoded data sequence 102 and generates a checksum signal for each row. When all of the decoded sequence data 102 are input into the checksum generator 5, checksum symbols 103 for (l+1) symbols for respective rows are completed. On the other hand, the inner code decoder 4 issues error number flags 104 upon decoding of the inner code. The error number flag counter 7 counts error number flags 104 in every class and sends the occurrence number data 105 of the error number flags the decoding mode decision circuit 8 upon completion of the decoding of the input sequence data 101 having $[l+1]\times[k+r]$ symbols by the inner decoder 4. The decoding mode decision circuit 8 decides the decoding modes corresponding the occurrence number data 105 of the error number flags. The decoding mode decision circuit 8 will determine a decoding mode as one of the aforementioned first type decoding method, second type decoding method or third type decoding method.

When the case is the decoding mode I, the error detection flag generator 11 issues uncorrectable error detection flag 106 to the output terminal. When the case is the decoding mode III, a zero criterion circuit 10 decides whether the checksum data 103 is zero or nonzero, and if the decision result is zero, a no error condition in the temporary memory 6 is determined. At this time, the data contents of the temporary memory 6 are issued as the output data sequence 107 to the external output terminal. On the other hand, when the decision result is not zero, the zero decision circuit 10 issues a signal to cause an error detection flag generator 11 to issue an uncorrectable error detection flag 106 to the output circuit.

When the case is the decoding mode II, contents of data sequence marked by a pointer 108, which is decided by the pointer generation circuit 9 among the error number flags 104, is transmitted from the temporary memory 6 to the checksum generator 5, and the contents of the data sequence from the temporary memory 6 is added to the already obtained checksum data to perform exclusive OR operations thereof. The resultant EX-OR data are stored in the temporary memory at the address designated by the pointer 108, and thereafter the contents of the temporary memory are issued as the output data sequence 107 to the external output terminal. Hereupon, when the inner codes are made into BCH code or Reed-Solomon code, the decoders described in detail in the texts of coding theory such as "Algebraic Coding Theory" by E. R. Berlekamp, (McGraw-Hill Book Company, 1968) can be used for the inner decoder 4.

Figure 5:
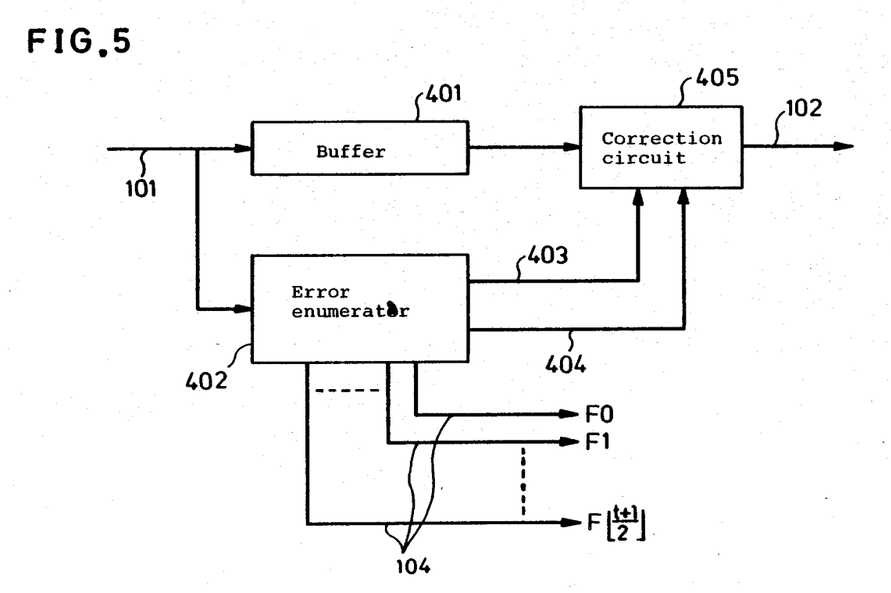
FIG. 5 is a block diagram of an inner code decoder 4 of FIG. 4.

The inner decoder 4 can be schematically represented as shown in FIG. 5. The input sequence 101 is input to a sequential buffer 401 and error enumerator 402, and the error enumerator 402 issues error position and error value of the codeword upon every completion of input of code word of one inner code. During that process the error enumerator 402 issues a number of errors occurring in the codeword as the error number flags 104 (comprising F0, F1, . . .

$$F\left[\underline{\tfrac{l+1}{2}}\right]).$$

By utilizing error position data 403 and error value data 404 issued from the error enumerator 402, the correction unit 405 performs error correction against an input data sequence 101 of one codeword stored in the buffer memory 401, and issues a decoded data sequence 102.

The most important process in the decoding system of the present invention is the determination of the decoding mode through statistical processing of the error number flags. Here, one practical example to carry out the statistical processing of the error number flags for the product code having the minimum distance 10 is described.

Figure 6A:
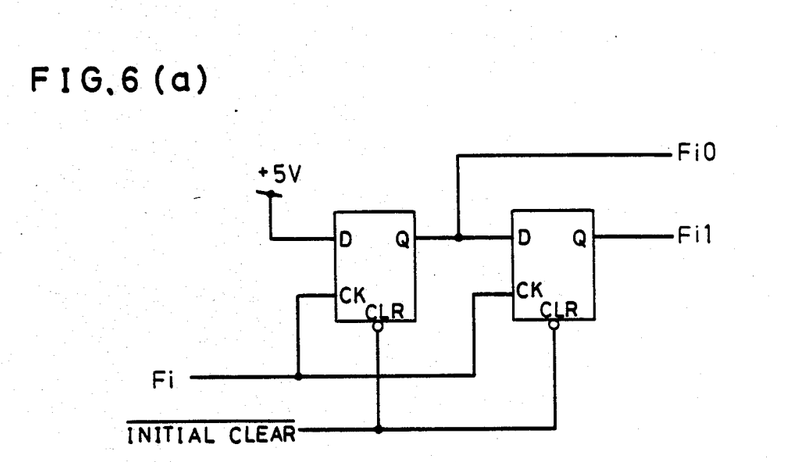
Figure 6B:
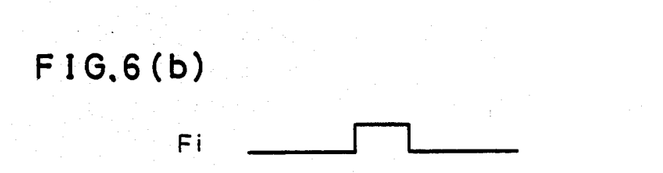

FIG. 6a shows one example of the error number flag counter 7 for the error number flag Fi. This circuit is provided respectively to count the occurrences of each of the error number flag outputs F1, F2, . . .

$$F\left[\underline{\tfrac{l+1}{2}}\right]$$

of error enumerator 402 shown in FIG. 5. When the error number flag Fi takes place, and a pulse as shown in FIG. 6b is generated thereby, the circuit shown in FIG. 6a counts the error number. The decoding system in accordance with the present invention necessitates classification of only three numbers of Ci namely, $Ci=0$, $Ci=1$ and $Ci\geq 2$ for the number of occurrence of the error number flags Fi, and therefore the circuit shown in FIG. 5 is sufficient. Responding to H-level and L-level of the outputs Fi0 and Fi1 of the circuit, the number Ci of the occurrences of Fi are decided as shown in the following truth table.

TABLE 2

| Number Ci of the occurrence of Fi | Fi0 | Fi1 |
|---|---|---|
| Ci = 0 | L | L |
| Ci = 1 | H | L |
| Ci ≧ 2 | H | H |

The decoding mode decision circuit 8 decides the decoding mode using the following logic. Here the decoding mode I, decoding mode II and decoding mode III are represented respectively by M1, M2 and M3. In the first type decoding method:

$$M1 = F_{30} \cdot F_{31}$$

$$M2 = F_{30} \cdot \overline{F_{31}} + \overline{F_{30}} \cdot \overline{F_{31}} \cdot F_{20} \cdot \overline{F_{21}} +$$

$$\overline{F_{30}} \cdot \overline{F_{31}} \cdot \overline{F_{20}} \cdot \overline{F_{21}} \cdot F_{10} \cdot \overline{F_{11}}$$

$$M3 = \overline{F_{30}} \cdot \overline{F_{31}} \cdot F_{20} \cdot F_{21} + \overline{F_{30}} \cdot \overline{F_{31}} \cdot \overline{F_{20}} \cdot \overline{F_{21}} \cdot F_{10} \cdot F_{11} +$$

$$\overline{F_{30}} \cdot \overline{F_{31}} \cdot \overline{F_{20}} \cdot \overline{F_{21}} \cdot \overline{F_{10}} \cdot \overline{F_{11}}.$$

In the second type decoding method:

$$M1 = F_{30} \cdot \overline{F_{31}}$$

$$M2 = F_{30} \cdot F_{31}$$

$$M3 = \overline{F_{30}} \cdot \overline{F_{31}}.$$

Accordingly, the decoding mode decision circuit 8 can be realized by combinations of simple AND and OR logic circuits.

Figure 7:
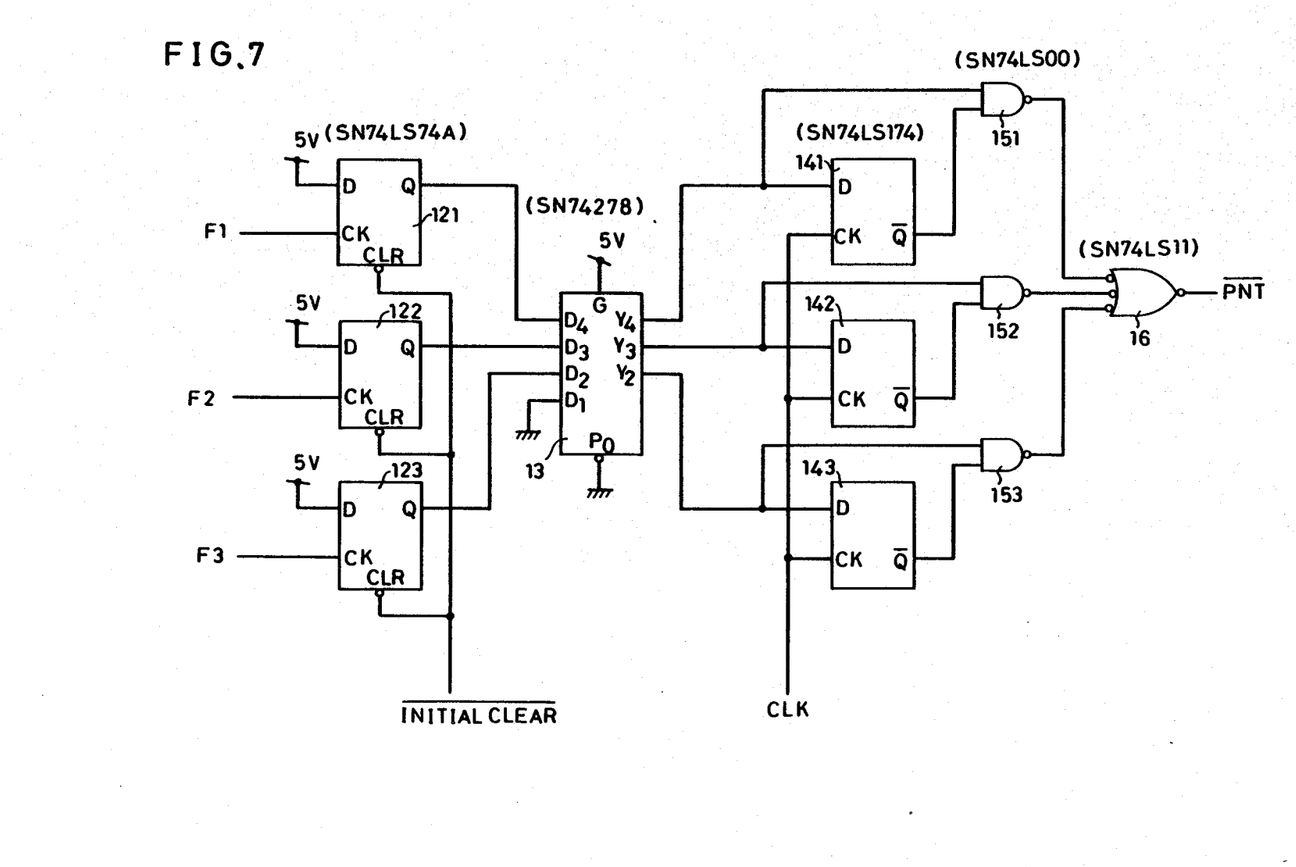
FIG. 7 is a circuit diagram showing one example of circuit configuration of a pointer generator 9 of the decoding system of FIG. 4.

Nextly, one example of the pointer generator 9 is elucidated with reference to FIG. 7. The pointer is necessary only when the case is the decoding mode II, and the decoding mode is not determined until completion of the decoding of (l+1) inner codes. Therefore, a provisional pointer is put on the inner code allowing the possibility of the pointer being put on, and when error number flags of higher priority order arises, the provisional pointer is revised.

Figure 8:
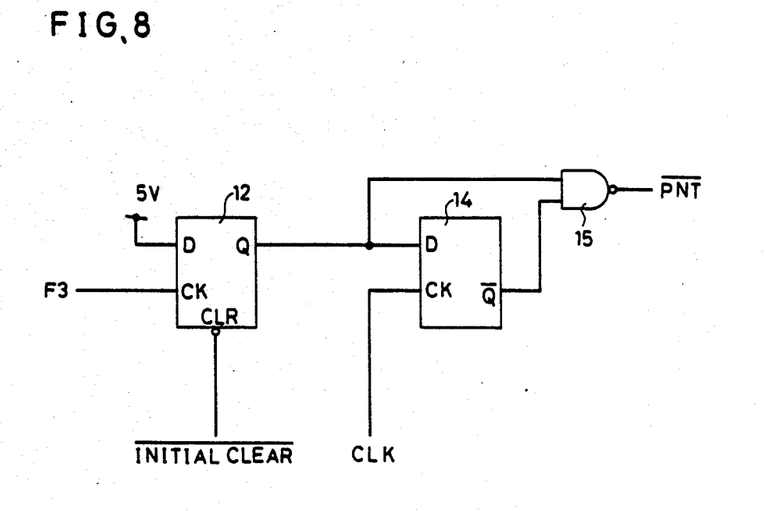
FIG. 8 is a circuit block diagram of another embodiment in accordance with the present invention.

FIG. 7 is an example of an actual circuit of the pointer generation circuit. The circuit has three D-flip-flops 121, 122 and 123, output terminals which are connected to a 4-bit cascadeable priority register 13(SN74278, made by TEXAS Instrument Inc.), and the D-flip-flops 121, 122 and 123 are cleared up by initial clear signal and set by the error number flags initially input thereto. The error number flags F1, F2 and F3 are input to the D-flip-flops 121, 122 and 123, respectively, and the outputs from the flip-flops 121, 122 and 123 are input to the 4-bit cascadeable priority register 13 in the priority order of the error number flags. The register 13 changes its output only when an input of a higher priority order is inputted thereto. Output signals of the 4-bit cascadeable priority register 13 are given to the D-flip-flops 141, 142 and 143 and also to the NAND gates 151, 152 and 153, which when the output of the register 13 is changed from L-level to H-level, issue a short pulse. The short pulse is given to the AND gate 16, which accordingly issues output short signal $\overline{PNT}$ only when error number flag of higher priority order firstly arises. By this output $\overline{PNT}$, the address of the temporary memory 6 to which the decoded sequence 102 is temporarily stored is latched. Therefore the address of the temporary memory 6 which is latched by the last generated output $\overline{PNT}$ becomes a candidate of the pointer, and when the case is decided to be the decoding mode II, the latched address becomes the real pointer. In this second decoding method, the error number flag to be noted is only F3, and accordingly the pointer generation circuit 9 can become simple as shown in FIG. 8.

INDUSTRIAL UTILITY OF THE INVENTION

Optical information recording/reproducing apparatus or the like does not necessarily have satisfactory reliability, and there is inherent error characteristics in its recording medium. Accordingly, there is a severe demand to correct compound errors wherein random errors and burst errors should exist mixed together. Accordingly, in order to obtain error correction of the optical recording/reproducing apparatus, the product codes on which the decoding system in accordance with the present invention is applicable is very suitable. For instance, a case where a sector of error correction unit consists of 525 bytes which is the total of 512 bytes user data and 13 byte control data is considered. Herein, the control data is that which is to be used in sector identification or file identification or sector management by the optical information recording/reproducing apparatus, and for instance, this is data which is not accessible to users. The 525 bytes of data to be decoded is considered by symbol units of 4-bit symbols, and 1050 symbols are arranged to be represented by a matrix of 10 rows and 105 columns. Nextly, in each rows of 10 rows, checksums of 105 symbols are obtained, and the resultant checksums are added to the right ends, namely, at the 106 columns as the checksum symbols. And at each row of the 106 rows, the codings are made with a Reed-Solomon code of code length 15, information symbol number 10 and minimum distance 6 defined on Galois field (GF($2^4$)) wherein generator polyniminal G(x) of the Reed-Solomon is given $$G(x) = x^5 + a^6x^4 + 1 \cdot x^3 + a^2x^2 + a^{12}x + a^{10} \quad (3)$$

-continued
wherein: $a^4 + a + 1 = 0$.

As a result, the data to be recorded are coded into a product code with minimum distance 12 represented by a matrix of (15×106). When the coded data are stored in the direction of the row, and the stored coded data are decoded by using the aforementioned first decoding method in accordance with the present invention, random errors in the sectors until five symbols are completely corrected, and in the view point of probability the random errors until 212 symbols can be corrected. By the same method, compound errors consisting of, for instance, one burst error of 212 symbol length and one random error, or consisting of one burst error of 106 symbol length and any three symbol random error can be corrected.

Since the decoding system of the product code in accordance with the present invention has rather simple decoding procedure and the decoding is completed by sequential decoding of two kinds of code, the configuration is simple and high speed operation is possible. Transmission or recording/reproducing of digital information data at high speed and with high reliability is possible and the system has a great industrial utility.

What is claimed is:

1. An apparatus for detecting and correcting errors on product codes of minimum distance 2t symbols, with t being a positive integer, said product code including information of (k×l) symbols arranged in a matrix with k rows, each including information of l symbols, and l columns each including information of k symbols, with k and l being positive integers, each of said k rows including a checksum symbol appended to said information of l symbols in order to form (l+1) columns and to constitute a code of minimum distance t, and each of said (l+1) columns, including a set of parity check symbols of length r symbols appended to said information of k symbols in order to form (k+r) columns and to constitute codes of minimum distance t, said apparatus for detecting and correcting errors on product codes comprising:

first decoder means for decoding (l+1) codes with minimum distance t in the direction of a column;

error number flag counter means for classifying incoming error number flags issued from said first decoder means into plural classes and counting error number flags in respective classes;

decoding mode decision means for determining an order of said error number and assigning priority orders to said error number flags based on said order of said error number, and for classifying a decoding mode as one of: (a) decoding mode I when error number flags of the highest order are counted twice or more by said error number flag counter means, (b) decoding mode II when a counted number of said error number flags of the highest priority order in the set of error number flags which are counted at least once is 1, and (c) decoding mode III for cases other than the above-mentioned two cases (a) and (b); and second decoder means, responsive to said decoding modes determined by said decoding mode decision means, for: (1) performing a simple detection when the case is said decoding mode I, (2) performing an erasure error correction to a symbol in a column on which an error number flag of said highest order priority in the set of error number flags which are counted at least once is given by utilizing a code in said row when the case is said decoding mode II, and (3) performing error detection by using a symbol in a row when the case is said decoding mode III.

2. An apparatus for detecting and correcting errors on product codes in accordance with claim 1, wherein said second decoder comprises:
temporary memory means for storing an output of said first decoder means;
checksum generation means for generating a checksum in the direction of a row in a product code disposed in said matrix from an output of said first decoder means;
zero criterion means for determining whether all of said checksums generated by said checksum generation means are one of zero and non zero;
pointer generation means for producing a pointer to designate a column whereto erasure error correction is to be made; and
error detection asserting means for asserting an uncorrectable error when said checksum generation means determines that all of said checksums are non zero in said decoding mode I and in said decoding mode III.

3. An apparatus for detecting and correcting errors on product codes of minimum distance 2t, with t being a positive integer, said product code including information of (k×l) symbols arranged in a matrix with k rows and l columns, with k and l being positive integers,
each of said k rows including a checksum symbol of distance x to constitute (l+x) columns in order to form codes of minimum distance t, and
each of said (l+x) columns, including said columns for said x added checksum symbols, including a set of parity check symbols of distance r symbols constituting codes of minimum distance t to k symbols;
said apparatus for detecting and correcting errors on product codes comprising:
first decoder means for decoding (l+x) codes with minimum distance t in the direction of a column;
error number flag counter means for counting incoming error detection flags;
decoding mode decision means for classifying a decoding mode into: (a) decoding mode I when error detection flags are counted at least twice by said error number flag counter means, (b) decoding mode II when a counted number of said error detection flags is 1, and (c) decoding mode III when said counted number of said error detection flags is zero;
second decoder means, responsive to said decoding modes determined by said decoding mode decision means, for: (1) carrying out an asserting of simple detection when the case is said decoding mode I, (2) carrying out erasure error correction to the codeword in a column on which an error detection flag is given by utilizing a code in said row when the case is said decoding mode II, and (3) carrying out error detection by using a code in a row when the case is said decoding mode III.

4. An apparatus for detecting and correcting errors on product codes in accordance with claim 3, wherein said second decoder comprises:
temporary memory means for storing an output of said first decoder means;
checksum generation means for generating a checksum in the direction of a row in a product code disposed in said matrix from output of said first decoder means;
zero criterion means for determining whether all of said checksums generated by said checksum generation means are one of zero and non zero;
pointer generation means for producing a pointer to designate a column whereto erasure error correction is to be made; and
error detection asserting means for asserting an uncorrectable error existence when said checksum generation means determines that all checksums are non zero in said decoding mode I and in said decoding mode III.

5. An apparatus for detecting and correcting errors on product codes of minimum distance 2t, with t being a positive integer, said product code including information of (k×l) symbols arranged in a matrix with k rows and l columns, with k and l being positive integers,
each of said k rows including a checksum symbol as an (l+1) column to constitute codes of minimum distance 2 to l symbols; and
each of said (l+1) columns including a set of parity check symbols of length r symbols, added to information of k symbols in order to constitute codes of minimum distance t,
said apparatus for detecting and correcting errors on product codes comprising:
first decoder means for decoding (l+1) codes with minimum distance t in the direction of a column;
error number flag counter means for classifying incoming error number flags issued from said first decoder means into plural classes and for counting error number flags in respective classes;
decoding mode decision means for assigning priority orders to two or more of said error number flags including an error detection flag which is of a highest priority order, based on order to said error number, and for classifying a decoding mode as one of: (a) decoding mode I when error number flags of the highest order are counted at least twice by said error number flag counter means, (b) decoding mode II when a counted number of said error number flags of the highest priority order in the set of error number flags which are counted at least once is 1, and (c) decoding mode III for cases other than the abovementioned two cases (a) and (b); and
second decoder means, responsive to said decoding mode determined by said decoding mode decision means, for: (1) asserting a simple detection when the case is said decoding mode I, (2) correcting an erasure error to the codeword in a column on which an error number flag on said highest order priority in the set of error number flags which are counted at least once is given by utilizing a code in said row when the case is said decoding mode II, and (3) detecting an error by using a code in a row when the case is said decoding mode III.

6. An apparatus for detecting and correcting errors on product codes in accordance with claim 5, wherein said second decoder means comprises:
temporary memory means for storing an output of said first decoder means;
checksum generation means for generating a checksum in the direction of a row in a product code disposed in said matrix from an output of said first decoder means;

zero criterion means for deciding whether all of said checksums generated by said checksum generation means are one of zero and non zero;

pointer generation means for producing a pointer to designate a column whereto erasure error correction is to be made; and error detection asserting means for asserting an uncorrectable error condition when said checksum generation means decides that all the checksums are non zero in said decoding mode I and in said decoding mode III.

7. A decoding method for a product code of minimum distance 2t, where t is a positive integer, said product code including information of (k×l) symbols arranged in a matrix with k rows and l columns, with k and l being positive integers, and each of said k rows including a checksum symbol to constituting codes of minimum distance 2 to l symbols, and each of said columns including a set of parity check symbols added to said information of k symbols in order to constitute codes of minimum distance t, said decoding method comprising the steps of:

decoding (l+1) codes in respective rows;

producing error number flags indicative of said decoding;

determining an order of each error number flag;

allotting priority orders to said error number flags based on said order of said error number;

classifying a decoding mode into three decoding modes based on number of occurrence and kind, of said error number flags;

selectively carrying out one of: an error detection, a single erasure error correction and error detection using a code in a row, responsive to said decoding mode thereby to perform error correction and error detection as the whole product code.

8. An apparatus for detecting and correcting errors on product codes, each product code including information of (k×l) symbols arranged in a matrix having a first dimension of k and a second dimension of l, where k and l are positive integers indicating a number of symbols, said first dimension including a first error correction code of length x, and said second dimension including a second error correction code of length r, comprising:

first decoder means for decoding (l+x) codes in the direction of a column;

error number flag counter means for classifying incoming error number flags issued from said first decoder means into plural classes and counting error number flags in respective classes;

decoding mode decision means for assigning priority orders to said error number flags based on an order of said error number, and for classifying a decoding mode as one of: (a) a decoding mode I when error number flags of a highest order are counted twice or more by said error number flag counter means, (b) a decoding mode II when a counted number of said error number flags of the highest priority order in the set of error number flags which are counted at least is 1, and (c) decoding mode III for cases other than the above-mentioned two cases (a) and (b); and second decoder means, responsive to said decoding modes determined by said decoding mode decision means, for: (1) performing a simple detection when the case is said decoding mode I, (2) performing an erasure error correction to a symbol in a column on which an error number flag of said higher order priority in the set of error number flags which are counted at least once is given by utilizing a code in said row when the case is said decoding mode II, and (3) performing error detection by using a symbol in a row when the case is said decoding mode III.

* * * * *

UNITED STATES PATENT AND TRADEMARK OFFICE
CERTIFICATE OF CORRECTION

PATENT NO. : 4,653,051
DATED : March 24, 1987
INVENTOR(S) : SUGIMURA et al

It is certified that error appears in the above-identified patent and that said Letters Patent is hereby corrected as shown below:

On the title page

[30]  Foreign Application Priority Data      should read:

--Sept. 14, 1983  [JP]  Japan..........58-169565

Nov. 28, 1983  [JP]  Japan...........58-223601--

Signed and Sealed this

First Day of March, 1988

*Attest:*

DONALD J. QUIGG

*Attesting Officer*          *Commissioner of Patents and Trademarks*